United States Patent
Kawano et al.

(10) Patent No.: US 8,058,165 B2
(45) Date of Patent: Nov. 15, 2011

(54) SEMICONDUCTOR DEVICE AND METHOD OF MANUFACTURING THE SAME

(75) Inventors: Masaya Kawano, Kanagawa (JP); Koji Soejima, Kanagawa (JP); Yoichiro Kurita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/853,660

(22) Filed: Aug. 10, 2010

(65) Prior Publication Data

US 2010/0297811 A1 Nov. 25, 2010

Related U.S. Application Data

(62) Division of application No. 11/491,180, filed on Jul. 24, 2006, now Pat. No. 7,800,233.

(30) Foreign Application Priority Data

Jul. 26, 2005 (JP) .................................. 2005-215409

(51) Int. Cl.
*H01L 21/30* (2006.01)
*H01L 21/46* (2006.01)
*H01L 21/44* (2006.01)
*H01L 21/4763* (2006.01)

(52) U.S. Cl. ........ 438/629; 438/614; 438/656; 438/622; 438/459

(58) Field of Classification Search .................. 438/672, 438/613, 614, 608, 611, 615, 107, 618, 620, 438/629, 637, 639, 640, 667, 668, 675, 700, 438/701, 713, 638, 622, 624, 625, 458, 459, 438/460, 652, 656, 678

See application file for complete search history.

(56) References Cited

U.S. PATENT DOCUMENTS

| | | | |
|---|---|---|---|
| 6,562,656 B1 * | 5/2003 | Ho | 438/107 |
| 6,603,210 B2 * | 8/2003 | Kishimoto et al. | 257/781 |
| 6,612,136 B2 | 9/2003 | Roe | |
| 6,908,784 B1 | 6/2005 | Farnworth et al. | |
| 6,915,566 B2 | 7/2005 | Abbott et al. | |
| 7,535,095 B1 | 5/2009 | En et al. | |
| 2002/0106893 A1 | 8/2002 | Furukawa et al. | |
| 2005/0136634 A1 | 6/2005 | Savastiouk et al. | |
| 2005/0155222 A1 | 7/2005 | Nakamura | |
| 2006/0063312 A1 * | 3/2006 | Kurita | 438/127 |
| 2008/0265434 A1 | 10/2008 | Kurita | |

FOREIGN PATENT DOCUMENTS

| | | |
|---|---|---|
| JP | 08-167629 | 6/1996 |
| JP | 2002-343931 | 11/2002 |
| JP | 2004-39867 | 2/2004 |

(Continued)

OTHER PUBLICATIONS

Chinese Patent Office issued a Chinese Office Action dated Sep. 25, 2009, Application No. 200810215852.7.
Taiwanese Patent Office issued a Taiwanese Office Action dated Sep. 17, 2009, Application No. 98091287.

(Continued)

*Primary Examiner* — Chuong A. Luu
(74) *Attorney, Agent, or Firm* — Young & Thompson

(57) ABSTRACT

A method of manufacturing according to an embodiment of the present invention includes forming a seed metal layer 20a on a supporting substrate 70, forming an interconnect layer 10 including an interconnect 18 on the seed metal layer 20a, removing the supporting substrate 70 after forming the interconnect layer 10, and patterning the seed metal layer 20a thus to form an interconnect 20 after removing the supporting substrate.

8 Claims, 19 Drawing Sheets

FOREIGN PATENT DOCUMENTS

| | | |
|---|---|---|
| JP | 2004-265967 | 9/2004 |
| JP | 2004-304196 | 10/2004 |
| JP | 2005-101137 | 4/2005 |
| TW | 200507204 | 2/2005 |
| TW | 236571 | 7/2005 |

OTHER PUBLICATIONS

Japanese Office Action mailed Sep. 14, 2010 in corresponding Japanese Application No. 2005-215409 and English translation of pertinent part.

* cited by examiner

SEMICONDUCTOR DEVICE AND METHOD OF MANUFACTURING THE SAME This application is based on Japanese patent application No. 2005-215409, the content of which is incorporated hereinto by reference. This application is a DIV. of 11/491,180 filed on Jul. 24, 2006, now U.S. Pat. No. 7,800,233.

BACKGROUND

1. Technical Field

The present invention relates to a semiconductor device and a method of manufacturing the same.

2. Related Art

Methods of manufacturing a semiconductor device so far developed include those disclosed in Japanese Laid-open patent publications No. 2005-101137 (Patent Document 1) and No.H08-167629 (Patent Document 2). According to the former, an interconnect layer is formed on an ultra-thin copper foil provided on a supporting substrate constituted of a supporting layer and a carrier copper foil. Then the supporting substrate is peeled off at the interface from the ultra-thin copper foil, thus to separate the supporting substrate and the interconnect layer, after which the ultra-thin copper foil is removed from the interconnect layer.

According to the latter, an interconnect is formed in a predetermined pattern on a transfer substrate, and the interconnect is sealed in a resin with a semiconductor substrate placed thereon. Then the transfer substrate is peeled off from the interconnect at the interface between the transfer substrate and the interconnect, thus to separate the transfer substrate and the semiconductor package.

SUMMARY OF THE INVENTION

The present inventors have discovered that the foregoing conventional techniques have the following drawbacks. By the method according to the Patent Document 1, the ultra-thin copper foil is finally removed from the interconnect layer, thus turning the ultra-thin copper foil into a waste. This leads to an increase in manufacturing cost of the semiconductor device.

According to the Patent Document 2, it is a patterned interconnect that is formed on the transfer substrate. Accordingly, when forming another interconnect on such interconnect after providing an insulating layer on the first interconnect, to thereby build an interconnect layer, planarity of the interconnect layer is degraded because of the unevenness of the first interconnect formed on the transfer substrate.

According to the present invention, there is provided a method of manufacturing a semiconductor device, comprising forming a seed metal layer on a supporting substrate; forming an interconnect layer including a first interconnect on the seed metal layer; removing the supporting substrate after the forming of the interconnect layer; and patterning the seed metal layer thus to form a second interconnect, after the removing of the supporting substrate.

By the method thus arranged, an interconnect is patterned on the seed metal layer, thus to form the second interconnect. Such method allows utilizing the seed metal layer as an interconnect in the semiconductor device to be fabricated, instead of removing as a waste. Also, the method does not require providing any extra metal layer for forming the second interconnect, in addition to the seed metal layer. The proposed method, therefore, suppresses an increase in manufacturing cost.

Further, the interconnect layer is formed on the seed metal layer prior to the patterning thereof. Accordingly, the interconnect layer is formed on the seed metal layer which is flat, and hence the interconnect layer attains high planarity.

Thus, the present invention provides a semiconductor device that includes an interconnect layer having high planarity, and a method of manufacturing such semiconductor device without incurring any increase in manufacturing cost.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
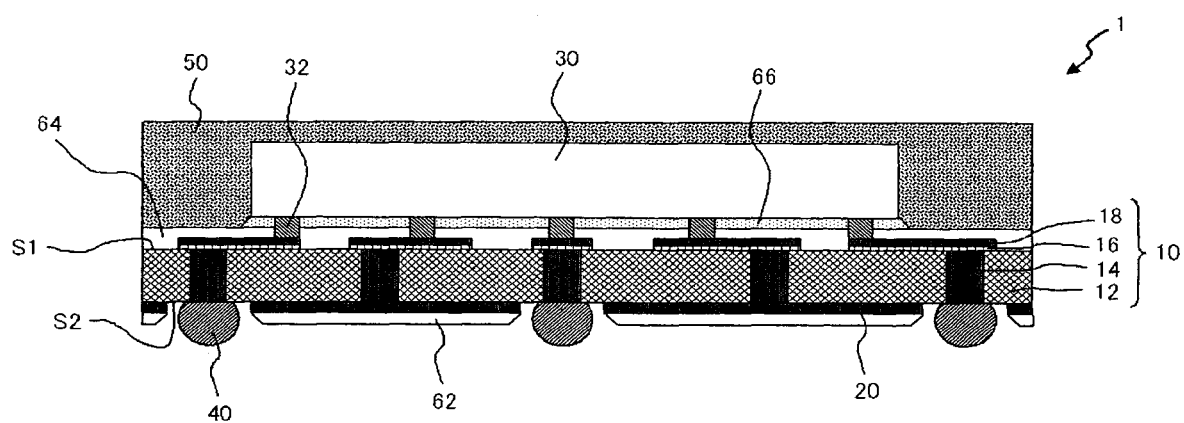
FIG. 1 is a schematic cross-sectional view showing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the identical numerals, and duplicating description may be omitted where appropriate.

FIG. 1 is a schematic cross-sectional view showing a semiconductor device according to an embodiment of the present invention. The semiconductor device 1 includes an interconnect layer 10, an interconnect 20, a semiconductor chip 30, solder balls 40, and a sealing resin 50. The interconnect layer 10 includes an insulating resin layer 12, via plugs 14, an adhesive conductive film 16, and an interconnect 18.

Materials suitable for constituting the insulating resin layer 12 include PBO (polybenzooxazole) and a polyimide resin. The polyimide resin may be a photosensitive polyimide resin or a non-photosensitive polyimide resin. The insulating resin layer 12 includes the via plugs 14 (first via plug). The via plugs 14 penetrate the insulating resin layer 12. In this embodiment, the via plugs 14 are constituted of copper.

On one of the surfaces S1 (first surface) of the insulating resin layer 12, the adhesive conductive film 16 (first adhesive conductive film) is provided. The adhesive conductive film 16 is connected to an end portion of each via plug 14. In this embodiment the adhesive conductive film 16 is an adhesion metal layer including a plurality of metal layers. The topmost layer (layer contacting the interconnect 18) of the adhesive conductive film 16 is preferably constituted of the same metal as that constituting the interconnect 18. In this embodiment, the adhesive conductive film 16 includes two layers, which are a titanium film and a copper film. In other words, the adhesive conductive film 16 includes the titanium film provided on the surface S1, and the copper film provided on the titanium film.

On the adhesive conductive film 16, the interconnect 18 (first interconnect) is provided. In this embodiment, the interconnect 18 is a copper interconnect. Such interconnect 18 is electrically connected to the via plugs 14 via the adhesive conductive film 16.

On the other surface (second surface) S2 of the insulating resin layer 12, the interconnect 20 (second interconnect) is provided in direct contact with the insulating resin layer 12. The interconnect 20 is directly connected to the other end portion (opposite to the adhesive conductive film 16) of the via plugs 14, for electrical connection. More specifically, the interconnect 20 and the via plugs are 14 made of the same metal (copper in this embodiment) so as to be in a body. Thus, the interconnect 20 is disposed in direct contact with the insulating resin layer 12 and the via plugs 14, without intermediation by an adhesive conductive film or a barrier metal. The interconnect 20 may be employed as a ground plane. On the interconnect 20, a resist film 62 is provided.

Here, in the semiconductor device 1, the surface of the insulating resin layer 12 is not roughened. Accordingly, the adhesive conductive film 16 and the interconnect 20 are placed on the smooth surfaces of the insulating resin layer 12. Likewise, the sidewall of the via hole of the via plug 14 is not roughened either. Accordingly, the interface between the insulating resin layer 12 and the via plug 14 is also smooth.

On the surface S1 side of the insulating resin layer 12, the semiconductor chip 30 is provided. The semiconductor chip 30 is connected to the interconnect 18 via solders 32. Here, on the surface S1 a solder resist 64 is provided so as to cover the adhesive conductive film 16 and the interconnect 18. The solders 32 connected the interconnect 18 and the semiconductor chip 30 via openings provided through the solder resist 64. The semiconductor chip 30 is disposed above the solder resist 64, with a gap therefrom. The gap between the semiconductor chip 30 and the solder resist 64 is filled with an underfill resin 66.

On the surface S2 side of the insulating resin layer 12, the solder balls 40 are provided. The solder balls 40 are connected to those via plugs 14 that are not connected to the interconnect 20. The solder balls 40 serve as external electrode terminals of the semiconductor device 1.

On the solder resist 64, the sealing resin 50 is provided so as to cover the semiconductor chip 30. In this embodiment, the sealing resin 50 covers the entire lateral and upper surfaces of the semiconductor chip 30.

Figure 2A:
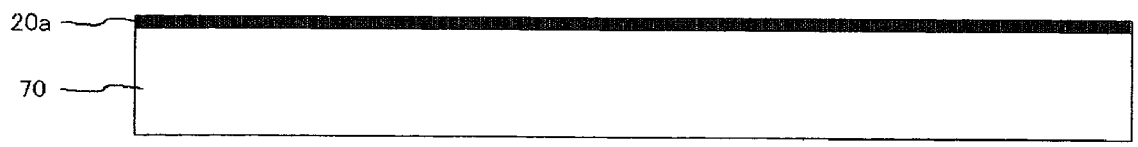
FIGS. 2A and 2B are schematic cross-sectional views progressively showing a method of manufacturing the semiconductor device shown in FIG. 1.

Now referring to FIGS. 2A through 6, a method of manufacturing such semiconductor device 1 will be described, as an embodiment of a method of manufacturing a semiconductor device according to the present invention. Firstly, a seed metal layer 20a is formed on a supporting substrate 70 by a sputtering process or the like. In this step, a delamination layer may be formed between the supporting substrate 70 and the seed metal layer 20a. In this embodiment, the supporting substrate 70 is a silicon substrate (FIG. 2A).

Figure 2B:
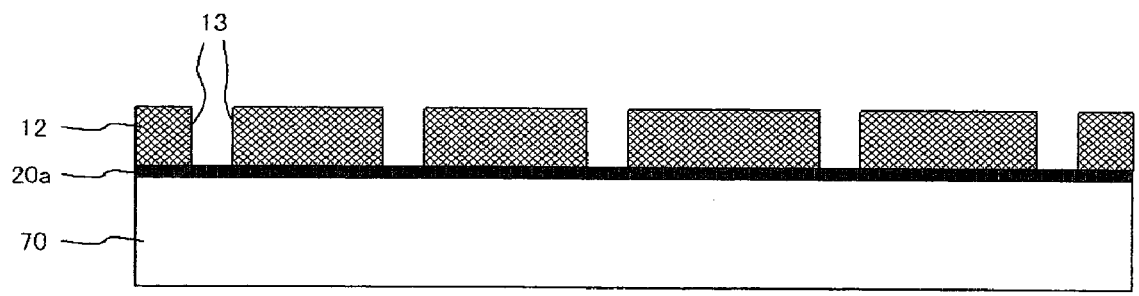

Then an insulating resin such as a photosensitive polyimide is applied to the seed metal layer 20a, after which the insulating resin is baked. The baking temperature may be set at 350 degree centigrade for example. At this stage, the insulating resin layer 12 is obtained. On the insulating resin layer 12, via holes 13 are formed by photolithography or the like (FIG. 2B).

Figure 3A:
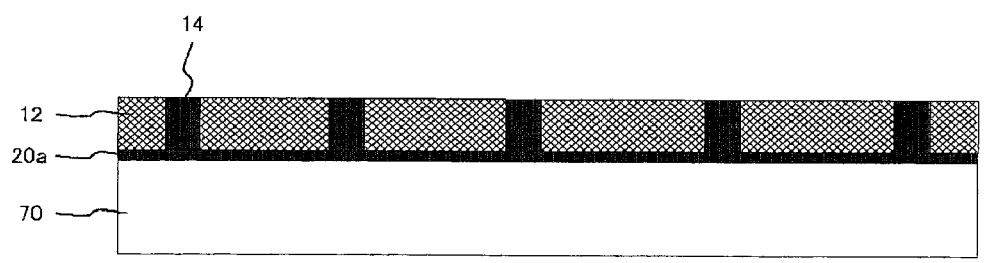
FIGS. 3A and 3B are schematic cross-sectional views progressively showing a method of manufacturing the semiconductor device shown in FIG. 1.

The via holes 13 are filled so as to form the via plugs 14. The formation of the via plugs 14 may be performed by electro plating, utilizing the seed metal layer 20a as the feeding layer (FIG. 3A). Here, the via plug 14 does not have to completely fill the via hole 13, in other words the via plug 14 may be formed so as to define a recess from the surface of the insulating resin layer 12.

On the insulating resin layer 12, where the via plugs 14 have been formed, a titanium film and a copper film are sequentially deposited, by a known process such as a sputtering or a CVD. Then a resist film is formed on the copper film, after which openings are formed through the resist film. These openings are located where the interconnect 18 is to be disposed. Under such state, for example electro plating is performed with the seed metal layer 20a acting as the feed layer, to thereby form the interconnect 18 in the openings. Then the resist film, the copper film and the titanium film are etched back so as to form the adhesive conductive film 16 and the interconnect 18. Such etch-back process may be a wet etching process that employs a mixed solution of sulfuric acid and hydrogen peroxide, or HF (hydrogen fluoride) as the etching solution. At this stage, the interconnect layer 10 is obtained.

Figure 3B:
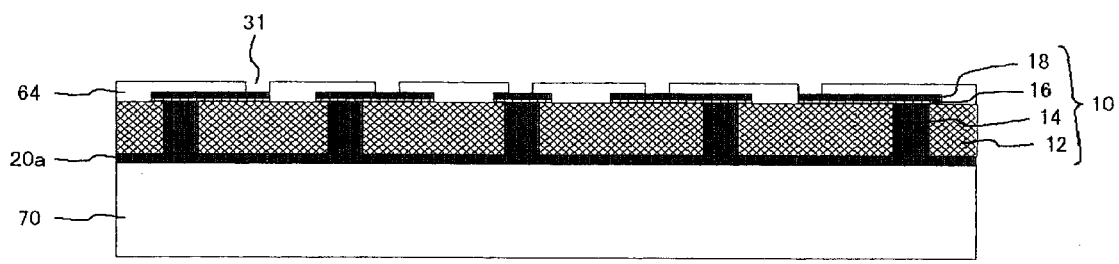

The solder resist 64 is then formed on the insulating resin layer 12 so as to cover the adhesive conductive film 16 and the interconnect 18, and openings 31 are formed through the solder resist 64 by photolithography or the like (FIG. 3B).

Figure 4A:
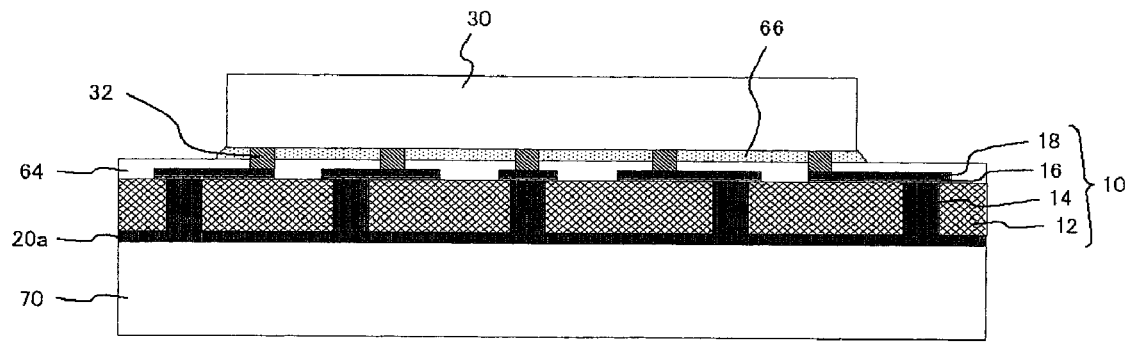
FIGS. 4A and 4B are schematic cross-sectional views progressively showing a method of manufacturing the semiconductor device shown in FIG. 1.
Figure 4B:
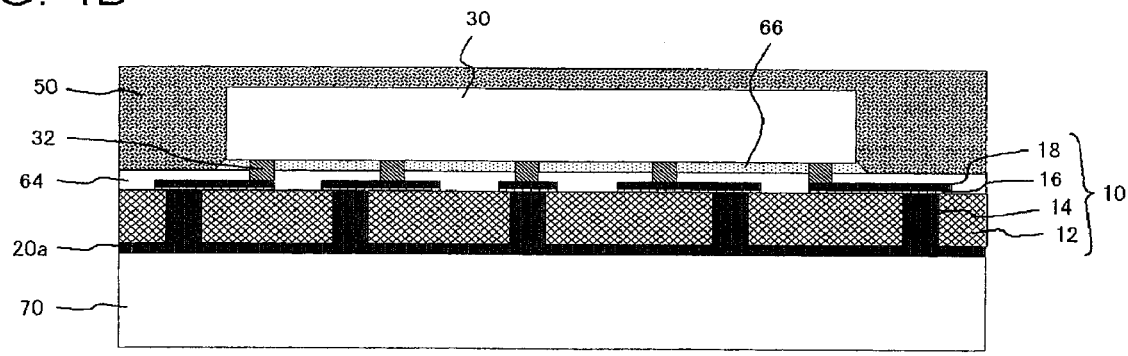

Then the electrodes (solders 32) of the semiconductor chip 30 are connected to the interconnect 18 via the openings 31, so that the semiconductor chip 30 is fixed on the interconnect layer 10. In this embodiment, a plurality of semiconductor chips 30, though not shown, is fixed on the interconnect layer 10 at a predetermined interval. After that, the gap between the semiconductor chip 30 and the solder resist 64 is filled with the underfill resin 66 (FIG. 4A). The sealing resin 50 is then provided so as to cover all the semiconductor chips 30 (FIG. 4B).

Figure 5A:
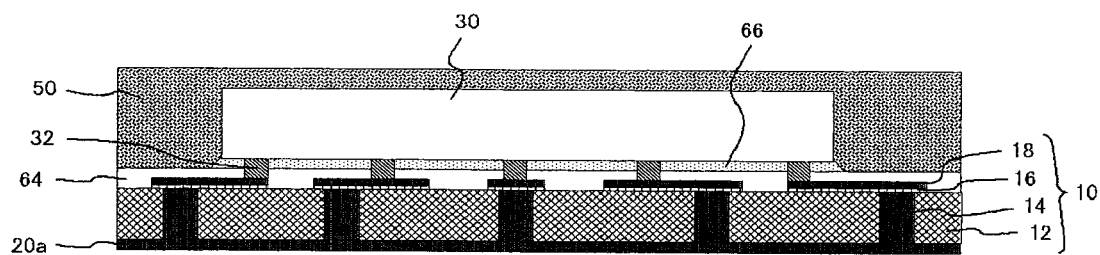
FIGS. 5A and 5B are schematic cross-sectional views progressively showing a method of manufacturing the semiconductor device shown in FIG. 1.

The supporting substrate 70 is now removed (FIG. 5A). The removal may be executed by a known process such as grinding, CMP or etching. Such processes may be employed in combination, for example after grinding the supporting substrate 70 the remaining portion may be removed by CMP or etching, or both. Either of dry etching or wet etching may be employed, although employing the dry etching at a final stage of the removal allows setting a higher rate in etching selectiveness, thereby facilitating stably preserving the seed metal layer 20a. Alternatively, the supporting substrate 70 may be delaminated at the interface with the seed metal layer 20a, thus removing the supporting substrate 70. In addition, after removing the supporting substrate 70, electro plating may be performed utilizing the seed metal layer 20a as the feed layer, so as to form a metal film on the seed metal layer 20a. Upon executing a dicing to split the semiconductor chips 30 into individual ones after removing the supporting substrate 70, a plurality of structures as shown in FIG. 5A can be obtained.

Figure 5B:
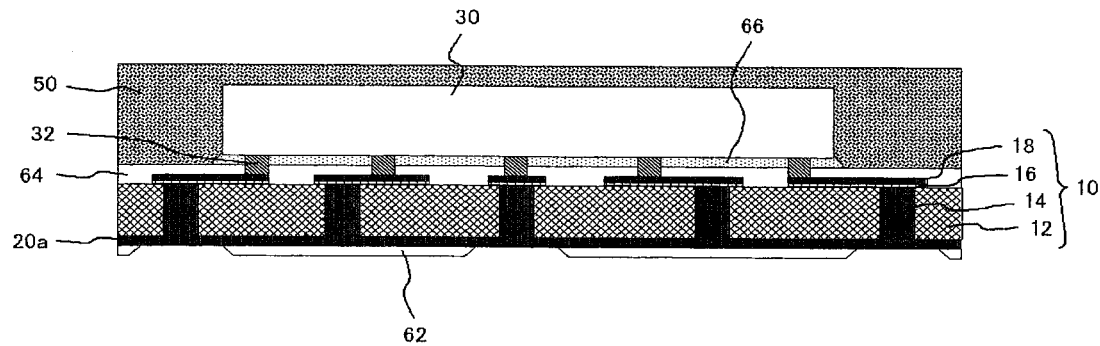

Then on the seed metal layer 20a, the resist film 62 is formed by screen printing or the like, for patterning of the seed metal layer 20a. Here, a resist material may be applied and then the pattern may be delineated thereon by laser abrasion, so as to form the resist film 62 (FIG. 5B).

Figure 6:
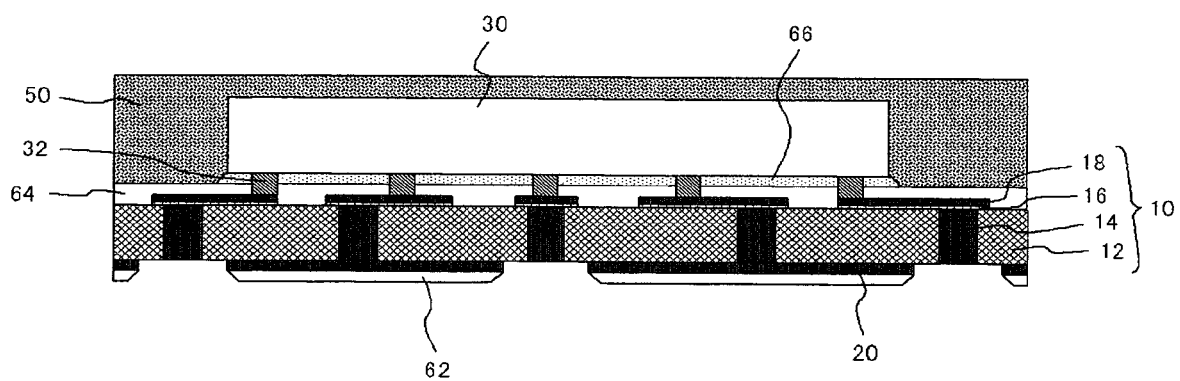
FIG. 6 is a schematic cross-sectional view showing a method of manufacturing the semiconductor device shown in FIG. 1.

Thereafter, the seed metal layer 20a is patterned into the interconnect 20, for example by wet etching utilizing the resist film 62 as the mask (FIG. 6). Here, upon forming the interconnect 20, the resist film 62 may be removed and electroless plating process may be performed so as to form a metal film on the interconnect 20. Then by forming the solder balls 40, the semiconductor device 1 shown in FIG. 1 is obtained.

The foregoing embodiment offers the following advantageous effects. In this embodiment, the seed metal layer 20a is patterned thus to form the interconnect 20. Accordingly, the seed metal layer 20a remains to serve as the interconnect 20 in the semiconductor device 1, instead of being removed. Also, there is no need to provide any extra metal film for forming the interconnect 20, in addition to the seed metal layer 20a. The proposed method, therefore, suppresses an increase in manufacturing cost.

Further, the interconnect layer 10 is formed on the seed metal layer 20a prior to the patterning process. Accordingly, the interconnect layer is formed on the seed metal layer 20a which is flat, and hence the interconnect layer 10 attains high planarity. Thus, the foregoing embodiment provides the semiconductor device 1 that includes the interconnect layer 10 having high planarity, and a method of manufacturing such semiconductor device without incurring any increase in manufacturing cost.

The interconnect 18 is formed on the insulating resin layer 12 via the adhesive conductive film 16. Interposing thus the adhesive conductive film 16 upgrades the adhesion between the insulating resin layer 12 and the interconnect 18.

When forming the insulating resin layer 12, an insulating resin is first applied to the seed metal layer 20a, and then the insulating resin is baked. Such process enhances the adhesion between the seed metal layer 20a and the insulating resin layer 12. This further leads to enhanced adhesion between the interconnect 20 and the insulating resin layer 12, in the semiconductor device 1.

The method thus arranged, accordingly, eliminates the need to interpose an adhesive conductive film or roughen the surface of the insulating resin layer 12, in order to secure sufficient adhesion between the interconnect 20 and the insulating resin layer 12. This leads to reduced electrical resistance such as an interconnect resistance, as well as upgraded high frequency transmission characteristics.

In the semiconductor device 1, actually, the interconnect 18 is provided on the insulating resin layer 12 via the adhesive conductive film 16, while the interconnect 20 is disposed in direct contact with the insulating resin layer 12. Such structure allows securing excellent adhesion between the respective interconnects 18, and the insulating resin layer 12, yet reducing electrical resistance and achieving high frequency transmission characteristics of the semiconductor device 1.

Figure 7:
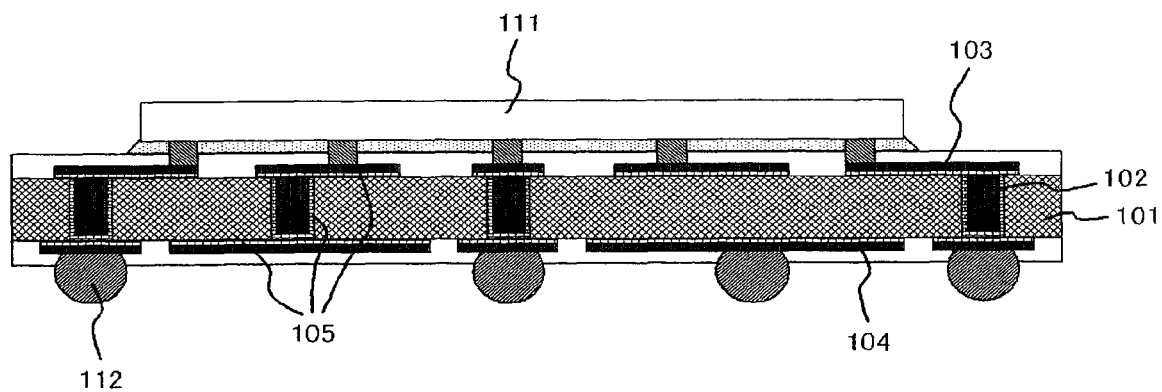
FIG. 7 is a schematic cross-sectional view showing a semiconductor device according to a comparative example.
Figure 8:
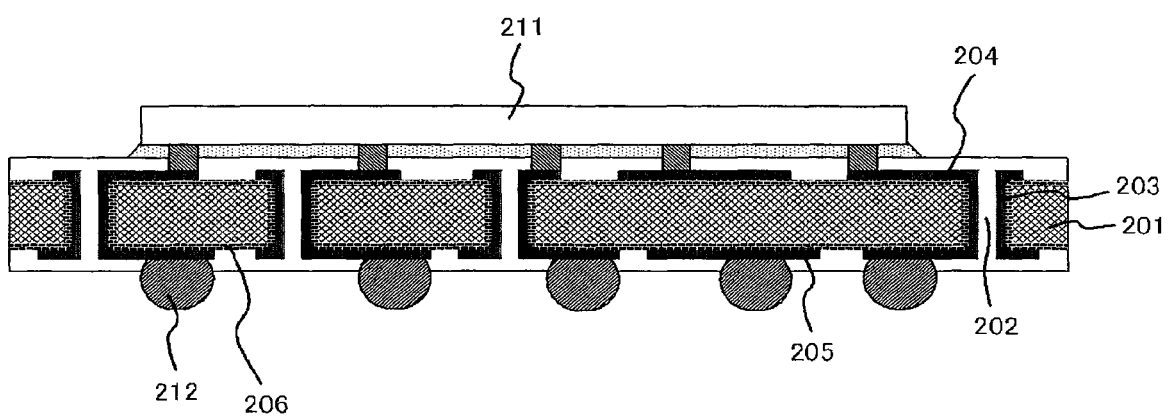
FIG. 8 is a schematic cross-sectional view showing a semiconductor device according to another comparative example.

Such aspect will be described in further details, referring to FIGS. 7 and 8. FIGS. 7 and 8 are cross-sectional views showing semiconductor devices comparative to the semiconductor device 1. In FIG. 7, an insulating resin layer 101 includes via plugs 102. On the respective surfaces of the insulating resin layer 101, an interconnect 103 and 104 connected to the via plugs 102 are provided. To the interconnect 103 and the interconnect 104, a semiconductor chip 111 and solder balls 112 are respectively connected.

Here, between the via plugs 102 and each of the interconnects 103, 104, and between the insulating resin layer 101 and each of the interconnects 103, 104, a barrier metal 105 is respectively provided. Likewise, between the insulating resin layer 101 and the via plugs 102 also, the barrier metal 105 is provided. Such structure, however, incurs an increase in electrical resistance, especially at the node between the via plugs 102 and the interconnects 103, 104. Besides, connection reliability at those nodes is also degraded.

Referring to FIG. 8 in turn, via plugs 203 are provided so as to cover the sidewall of via holes 202 formed through an insulating resin layer 201. On the respective surfaces of the insulating resin layer 201, an interconnect 204 and 205 connected to the via plugs 203 are provided. To the interconnect 204 and the interconnect 205, a semiconductor chip 211 and solder balls 212 are respectively connected.

Here, the surface of the insulating resin layer 201 is roughened into a resin-roughened surface 206. Accordingly, the via plugs 203 and the interconnects 204, 205 are provided on the resin-roughened surface 206. Such structure, however, incurs an increase in electrical resistance of both the via plugs 203 and the interconnects 204, 205. Besides, electron scattering takes place, thereby degrading the high frequency transmission characteristics.

In the semiconductor device 1, unlike those comparative examples, the interface of the insulating resin layer 12 and the interconnect 20 is free from an adhesive conductive film or a barrier metal. Also, the surface of the insulating resin layer 12 is not subjected to roughening, but is smooth. Therefore, the semiconductor device 1 can suppress an increase in electrical resistance, while achieving upgraded connection reliability between the via plug and the interconnect, as well as excellent high frequency transmission characteristics.

Performing the electro plating utilizing the seed metal layer 20a as the feeding layer, so as to form the via plugs 14, facilitates achieving an integral structure of the via plugs 14 and the interconnect 20 formed of the identical metal. Such structure can suppress an increase in electrical resistance between the via plugs 14 and the interconnect 20, and also upgrade the connection reliability between the via plugs 14 and the interconnect 20.

Performing a photolithography process on a photosensitive polyimide resin employed for constituting the insulating resin layer 12 allows precisely forming the via plugs 14 in a very fine pitch.

The semiconductor device 1 includes the sealing resin 50 that covers the semiconductor chip 30. Such structure improves the mechanical strength of the semiconductor device 1. In this embodiment in particular, the sealing resin 50 covers the entire lateral and upper surfaces of the semiconductor chip 30. Keeping thus the semiconductor chip 30 from being externally exposed results in upgraded reliability of the semiconductor device 1. However, it is not imperative to provide the sealing resin 50.

Further, when manufacturing the semiconductor device 1, the sealing resin 50 is provided so as to collectively cover a plurality of semiconductor chips 30 to be subsequently split into individual chips by dicing. Such method simplifies the manufacturing process, compared to individually sealing each semiconductor chip 30 with a resin. Moreover, providing the sealing resin 50 prior to removing the supporting substrate 70 facilitates the handling of the individual chips after the removal of the supporting substrate 70.

Preferably, a wet etching process may be adopted for patterning the seed metal layer 20a, thus to form the interconnect 20, from the viewpoint of reducing the manufacturing cost. This is because the interconnect 20 is provided on the surface S2 side of the insulating resin layer 12, i.e. on the side where the solder balls 40 are provided, and hence does not have to be as strictly precise as the interconnect 18 to be formed on the surface S1 side where the semiconductor chip 30 is to be provided. Accordingly, the wet etching can still secure sufficient precision in forming the interconnect 20.

Performing the electro plating, after removing the supporting substrate 70, with the seed metal layer 20a acting as the feeding layer thus to form a metal film on the seed metal layer 20a allows increasing the thickness of the seed metal layer 20a (hence the interconnect 20) to a desired extent, by a simple method. Likewise, performing electroless plating process after the formation of the interconnect 20, thus to form a metal film on the interconnect 20, also allows increasing the thickness of the seed metal layer 20a to a desired extent.

In the foregoing manufacturing method, interposing a delamination layer between the supporting substrate 70 and the seed metal layer 20a facilitates the subsequent removal of the supporting substrate 70. For example, employing a thermally decomposing material as the delamination layer enables separating the seed metal layer 20a and the supporting substrate 70, simply by applying a temperature higher than the thermal decomposition temperature of the delamination layer, at the step of removing the supporting substrate 70. Here, it is preferable to employ a laser for locally applying the heat. Setting the laser wavelength so that the laser is transmitted through the supporting substrate 70, but not through delamination layer, enables locally heating the delamination layer alone.

Alternatively, a material that degrades the adhesion strength of the interface between the supporting substrate 70 and the delamination layer, or the interface between the delamination layer and the seed metal layer 20a, may be selected in advance, so that the supporting substrate 70 may be removed by applying a mechanical force at the step of removing the supporting substrate 70. Another option is employing as the delamination layer such a material that dissolves in a specific solution, or that drastically degrades the adhesion with the seed metal layer 20a or with the supporting substrate 70 by an osmosis of a specific solution, and causing such solution to intrude from a lateral portion of the delamination layer thus to separate the supporting substrate 70.

Utilizing the interconnect 20 as a ground plane in the semiconductor device 1 allows securing an extensive shield surface, thereby further upgrading the high frequency transmission characteristics.

Figure 9:
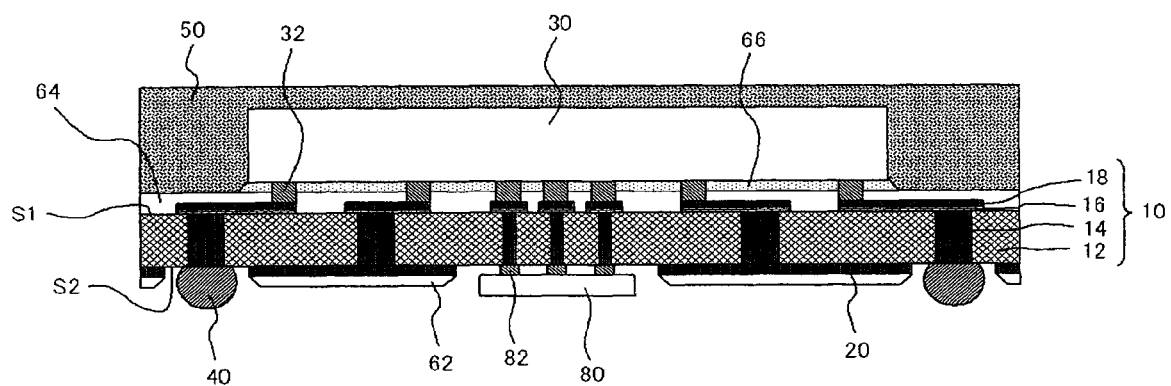
FIG. 9 is a schematic cross-sectional view showing a variation of the semiconductor device according to the embodiment.

The semiconductor device and the method of manufacturing the same according to the present invention are not limited to the foregoing embodiment, but various modifications may be made. To cite a few examples, as shown in FIG. 9, a semiconductor chip 80 (second semiconductor chip) may be provided on the surface S2 side of the insulating resin layer 12, not only on the surface S1 side. In FIG. 9, the semiconductor chip 80 is connected to the via plugs 14 via solders 82.

Figure 10:
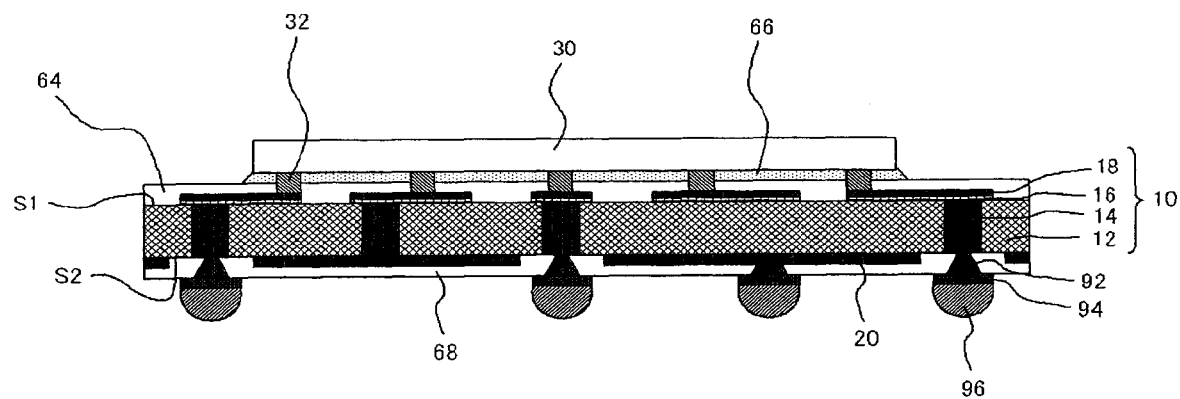
FIG. 10 is a schematic cross-sectional view showing another variation of the semiconductor device according to the embodiment.

Also as shown in FIG. 10, another via plug 92 (second via plug) with an end portion connected to the via plug 14 may be provided on the surface S2 side of the insulating resin layer 12. In FIG. 10, an insulating film 68 is provided so as to cover the interconnect 20, so that the via plug 92 is buried in an opening formed through the insulating film 68. The via plug 92 is in such a tapered shape that the cross-sectional area gradually decreases as getting closer to the via plug 14. Here, the via plug 14 and the via plug 92 are constituted of different metals from each other. Also, the via plug 14 and the via plug 92 are connected to each other via an adhesive conductive film (second adhesive conductive film, not shown). Such adhesive conductive film is provided on a resin layer (not shown) deposited on the surface S2 side of the insulating resin layer 12. The adhesive conductive film includes, like the adhesive conductive film 16, a plurality of metal films stacked on one another. Further, on the insulating film 68, an electrode pad 94 connected to the other end portion (opposite to the via plug 14) of the via plug 92 is provided. On the electrode pad 94, solder balls 96 are provided.

Figure 11:
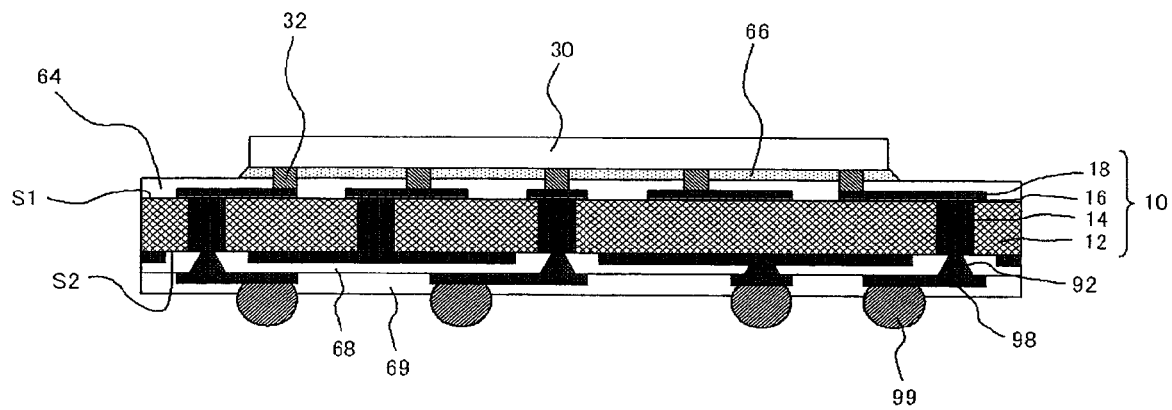
FIG. 11 is a schematic cross-sectional view showing still another variation of the semiconductor device according to the embodiment.

Further as shown in FIG. 11, the semiconductor device 1 may include an interconnect 98 (third interconnect) connected to the other end portion of the via plug 92. In other words, the semiconductor device 1 may include a multilayer interconnect on the surface S2 side of the insulating resin layer 12. The interconnect 98 is located in an insulating film 69 provided on the insulating film 68. To the interconnect 98, solder balls 99 are connected. Each of the solder balls 99 is partially buried in the insulating film 69.

Figure 12:
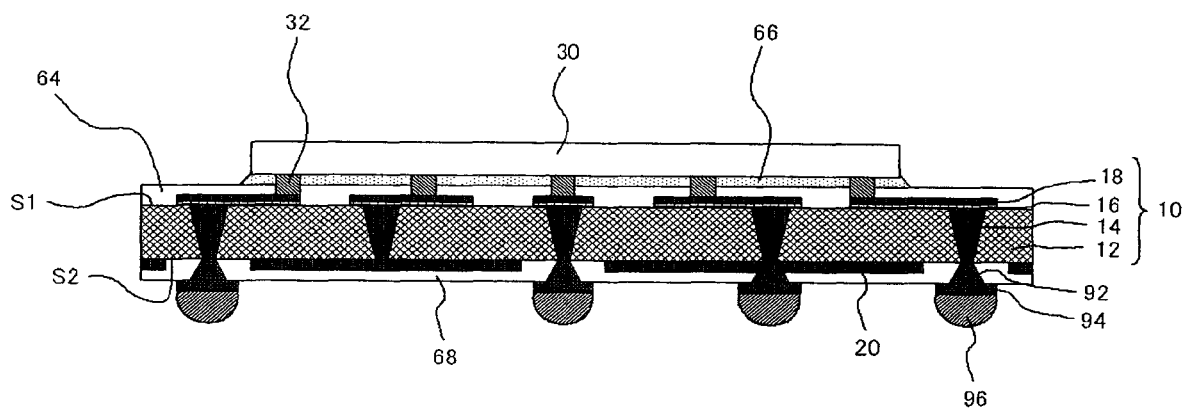
FIG. 12 is a schematic cross-sectional view showing still another variation of the semiconductor device according to the embodiment.
Figure 13:
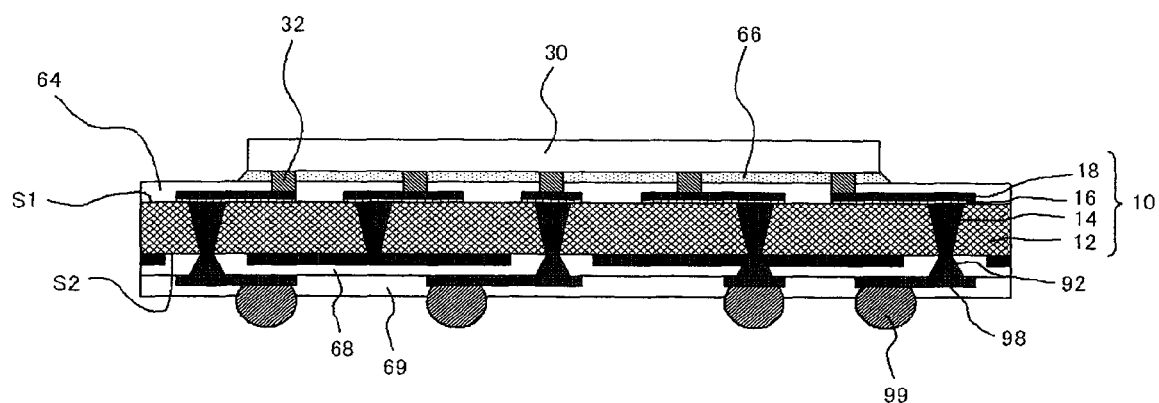
FIG. 13 is a schematic cross-sectional view showing still another variation of the semiconductor device according to the embodiment.

In FIGS. 10 and 11, the opposing via plugs 14 and 92 may be in an oppositely tapered shape across a boundary coinciding with the upper surface of the interconnect 20 (surface S2 side of the insulating resin layer 12). In other words, as shown in FIGS. 12 and 13, the via plug 14 may be in such a tapered shape that the cross-sectional area gradually decreases as getting closer to the via plug 92, while the via plug 92 may be in such a tapered shape that the cross-sectional area gradually decreases as getting closer to the via plug 14. Such configuration originates from the manufacturing process in which the via hole for the via plug 14 and the via hole for the via plug 92 are formed from mutually opposite directions. Specifically, the former is formed downwardly based on the orientation of the drawing, while the latter is formed upwardly based on the orientation of the drawing.

Figure 14:
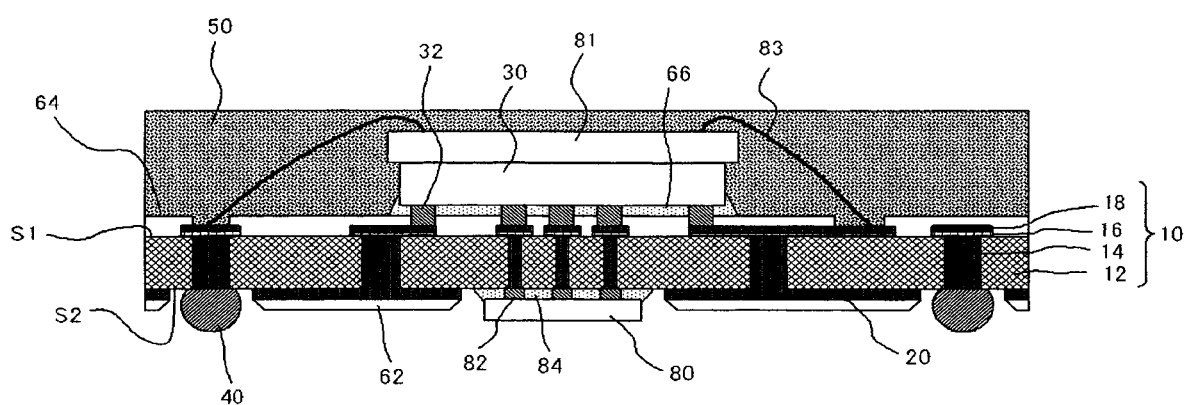
FIG. 14 is a schematic cross-sectional view showing still another variation of the semiconductor device according to the embodiment.
Figure 15:
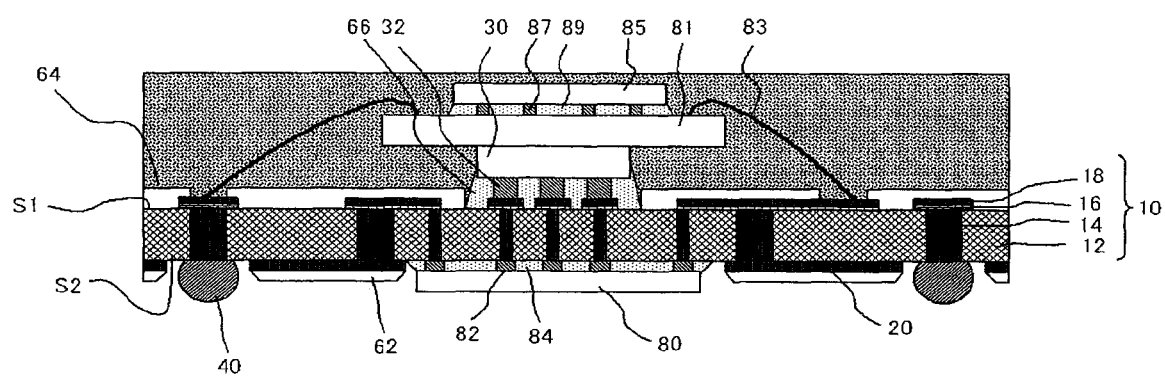
FIG. 15 is a schematic cross-sectional view showing still another variation of the semiconductor device according to the embodiment.

The semiconductor device according to the present invention may include three or more semiconductor chips. FIGS. 14 and 15 depict the semiconductor device including three and four semiconductor chips respectively. The semiconductor device shown in FIG. 14 includes, in addition to the semiconductor chip 30 and the semiconductor chip 80 (Ref.

FIG. 9), a semiconductor chip 81 (third semiconductor chip) provided on the semiconductor chip 30. The semiconductor chip 81 is connected to the interconnect 18 via a bonding wire 83. In FIG. 14, the gap between the semiconductor chip 80 and the insulating resin layer 12 is filled with an underfill resin 84.

The semiconductor device shown in FIG. 15 includes, in addition to the semiconductor chips 30, 80, 81, a semiconductor chip 85 (fourth semiconductor chip) provided on the semiconductor chip 81. The semiconductor chip 85 is connected to an electrode (not shown) of the semiconductor chip 81, via solders 87. The gap between the semiconductor chips 81 and 85 is filled with an underfill resin 89.

The semiconductor device according to the present invention may include a dummy chip. The dummy chip may be provided on an uppermost semiconductor chip on the surface S1 side of the insulating resin layer 12. When only one semiconductor chip is provided on the surface S1 side of the insulating resin layer 12, that semiconductor chip is regarded as the uppermost semiconductor chip.

Figure 16:
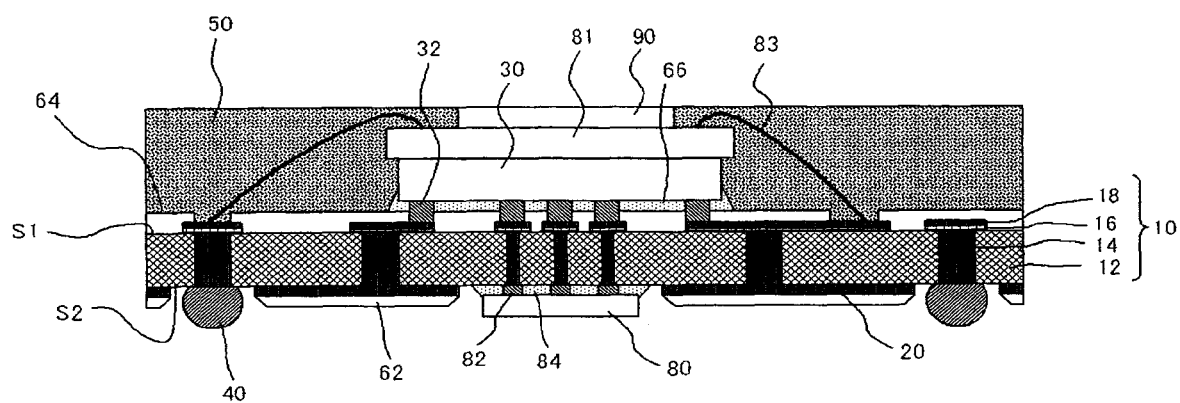
FIG. 16 is a schematic cross-sectional view showing still another variation of the semiconductor device according to the embodiment.
Figure 17:
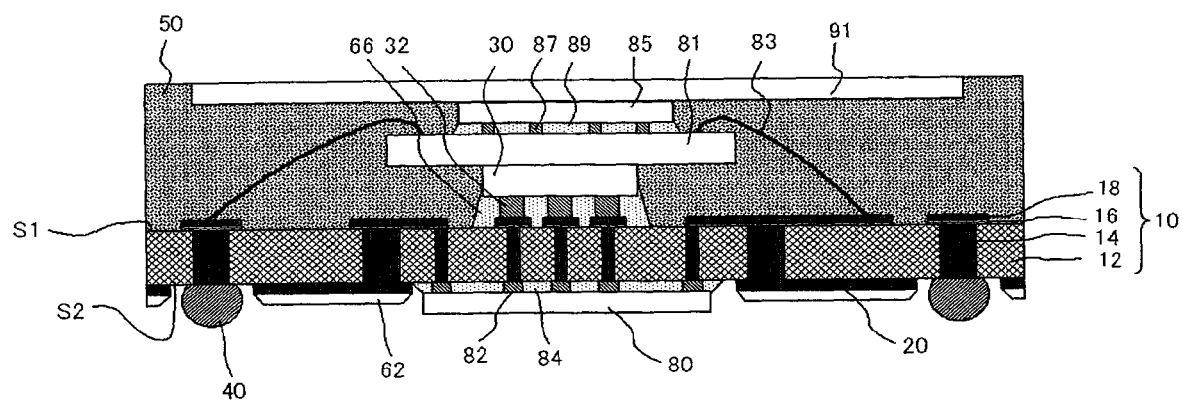
FIG. 17 is a schematic cross-sectional view showing still another variation of the semiconductor device according to the embodiment.

FIGS. 16 and 17 depict the semiconductor device of FIGS. 14 and 15 with the dummy chip, respectively. The former (FIG. 16) includes a dummy chip 90 on the semiconductor chip 81. The latter (FIG. 17) includes a dummy chip 91 on the semiconductor chip 85. The dummy chip 91 has a larger area than any of the semiconductor chips 30, 81, 85 provided on the surface S1 side.

Providing thus the dummy chips 90, 91 allows providing the sealing resin in a reduced thickness on the dummy chips 90, 91, or even eliminating the sealing resin. This improves heat dissipation efficiency of the semiconductor device. Especially the semiconductor device of FIG. 17 attains prominently better heat dissipation efficiency, because granting a large area to the dummy chip 91.

Figure 18:
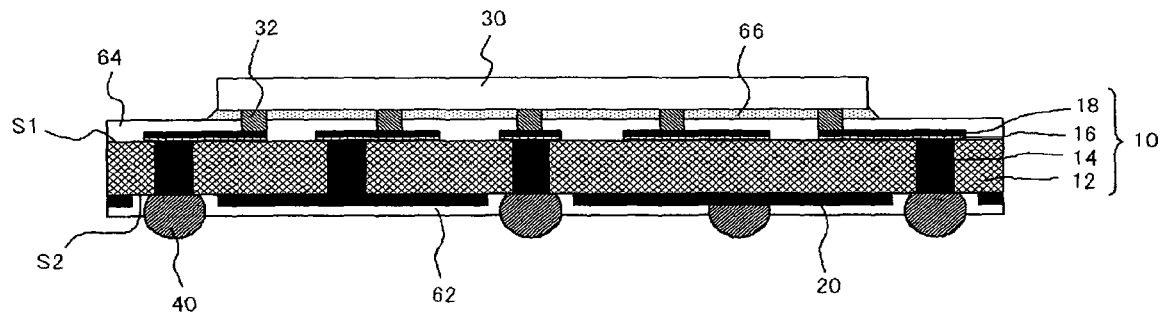
FIG. 18 is a schematic cross-sectional view showing still another variation of the semiconductor device according to the embodiment.
Figure 19:
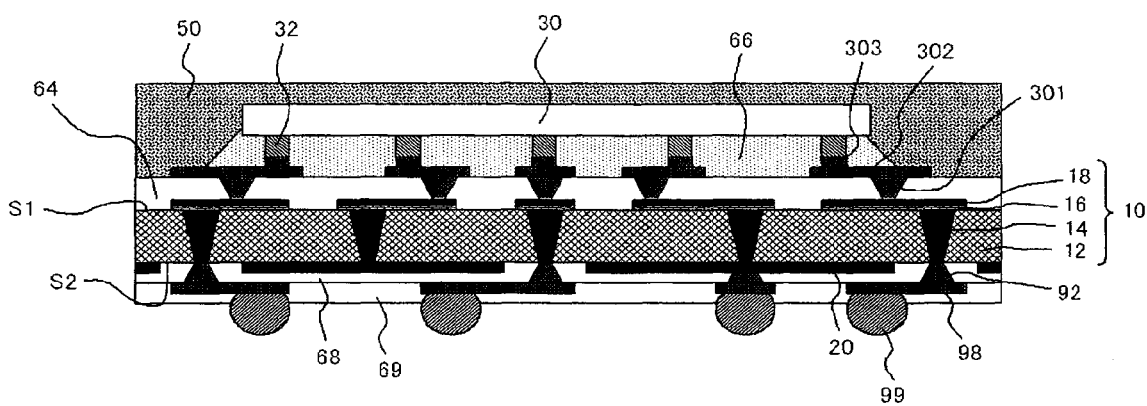
FIG. 19 is a schematic cross-sectional view showing still another variation of the semiconductor device according to the embodiment.

Referring to FIG. 18, each of the solder balls 40 may be partially buried in the resist film 62. Referring to FIG. 19, two or more interconnect layers may be provided on the surface S1 side of the insulating resin layer 12. In FIG. 19, the solder resist 64 includes via plugs 301 (third via plug). The via plug 301 has an end portion connected to the interconnect 18. The other end portion of the via plug 301 is connected to an interconnect 302 (fourth interconnect) provided on the solder resist 64. On the interconnect 302, posts 303 are provided. The post 303 may be a copper post. To each post 303, the solder 32 is connected.

It is apparent that the present invention is not limited to the above embodiment, and may be modified and changed without departing from the scope and spirit of the invention.

What is claimed is:

1. A method of manufacturing a semiconductor device, comprising:
   forming a seed metal layer on a supporting substrate;
   forming an interconnect layer including a first interconnect on said seed metal layer;
   removing said supporting substrate after said forming of said interconnect layer; and
   patterning said seed metal layer thus to form a second interconnect, after said removing of said supporting substrate,
   wherein said forming of said interconnect layer includes:
      forming an insulating resin layer on said seed metal layer;
      forming a via plug in said insulating resin layer; and
      forming said first interconnect on said insulating resin layer including said via plug; and
   wherein said forming of said via plug includes forming said via plug by electro plating utilizing said seed metal layer as a feeding layer.

2. The method according to claim 1, wherein said forming of said first interconnect includes forming said first interconnect on said insulating resin layer via an adhesive conductive film.

3. The method according to claim 1, wherein said forming of said insulating resin layer includes applying an insulating resin to said seed metal layer and then baking said insulating resin.

4. The method according to claim 1, wherein said forming of said insulating resin layer includes employing a photosensitive polyimide resin as said insulating resin; and said forming of said via plug includes forming a via hole for said via plug by photolithography.

5. The method according to claim 1, further comprising:
   fixing a plurality of semiconductor chips on said interconnect layer before said removing of said supporting substrate; and
   forming a sealing resin so that said sealing resin collectively cover said plurality of semiconductor chips.

6. The method according to claim 1, wherein said patterning of said seed metal layer includes patterning said seed metal layer by wet etching.

7. The method according to claim 1, further comprising:
   forming a metal film on said seed metal layer by electro plating utilizing said seed metal layer as a feeding layer, after said removing of said supporting substrate.

8. The method according to claim 1, further comprising:
   forming a metal film on said second interconnect by electroless plating.

* * * * *